United States Patent [19]
Ogihara et al.

[11] Patent Number: 6,054,726
[45] Date of Patent: Apr. 25, 2000

[54] LIGHT-EMITTING SEMICONDUCTOR DEVICE WITH PLANAR STRUCTURE

[75] Inventors: Mitsuhiko Ogihara; Yukio Nakamura; Hiroshi Hamano; Masumi Taninaka, all of Tokyo, Japan

[73] Assignee: Oki Data Corporation, Tokyo, Japan

[21] Appl. No.: 09/328,265

[22] Filed: Jun. 17, 1999

[30] Foreign Application Priority Data

Jul. 8, 1998 [JP] Japan ................... 10-193102

[51] Int. Cl.[7] ............................ H01L 33/00; H01S 3/19
[52] U.S. Cl. ................ 257/98; 257/88; 257/102; 372/45; 372/46; 372/96
[58] Field of Search ................ 257/88, 94, 98, 257/102, 103; 372/45, 46, 96

[56] References Cited

U.S. PATENT DOCUMENTS 5,903,590  5/1999  Hadley et al. .................. 372/96
5,963,576  10/1999  Claisse et al. .................. 372/96

OTHER PUBLICATIONS

Floyd et al. "Reduced Threshold Bottom Emitting Vertical Cavity Lasers by A1As Oxidation," SCL 14.2, 1996.

*Primary Examiner*—Minh Loan Tran
*Attorney, Agent, or Firm*—Venable; Robert J. Frank

[57] ABSTRACT

A light-emitting semiconductor device has a planar structure including two multilayer reflecting layers, two cladding layers, and an active layer of a first conductive type. The cladding layers have bandgap energies exceeding the bandgap energy of the active layer. The multilayer reflecting layers each include at least one constituent layer with a bandgap energy exceeding the bandgap energy of the active layer. An area of a second conductive type extends from the upper surface of the device through the upper multilayer reflecting layer and upper cladding layer into the active layer, forming a pn junction in the active layer. This planar structure is suitable for high-yield manufacturing.

22 Claims, 11 Drawing Sheets

LIGHT-EMITTING SEMICONDUCTOR DEVICE WITH PLANAR STRUCTURE

BACKGROUND OF THE INVENTION

The present invention relates to a light-emitting semiconductor device having a pn junction.

The known art abounds with light-emitting semiconductor devices. One example is illustrated in FIG. 11, in which light is emitted through an n-type gallium-arsenide (GaAs) substrate 11 by a vertical cavity laser comprising an n-type distributed Bragg reflector (DBR) 12, an active layer 13, and a p-type DBR 14, which are formed on the substrate 11. The device is driven by current flowing from a positive electrode or p-electrode 15, which makes contact with the p-type DBR 14, to a negative electrode or n-electrode 16, which makes contact with the substrate 11. The p-type DBR 14 has a mesa shape, formed by etching away material from the region 17 surrounding the mesa.

Compared with other light-emitting semiconductor devices, the device in FIG. 11 has the combined advantages of converting current to light efficiently, and emitting the light in a circular beam perpendicular to the surface of the device. The need for mesa etching, however, is a disadvantage. When an array of light-emitting devices must be formed on the same semiconductor substrate, for example, the need for mesa etching limits the density of the array. In addition, the irregular surface height created by mesa etching leads to problems that reduce the yield of the fabrication process. Specific problems include defocusing during photolithography, incomplete removal of photoresist material and electrode material, and electrical discontinuities in electrode lines.

SUMMARY OF THE INVENTION

An object of the present invention is to provide a light-emitting semiconductor device that can be fabricated at high density with high production yields.

The invented light-emitting semiconductor device comprises a semiconductor substrate with a first multilayer reflecting layer, a first cladding layer, an active layer of a first conductive type, a second cladding layer, and a second multilayer reflecting layer, arranged in this order. The first and second cladding layers have bandgap energies exceeding the bandgap energy of the active layer. The first and second multilayer reflecting layers each include at least one constituent layer with a bandgap energy exceeding the bandgap energy of the active layer.

An area of a second conductive type extends from the surface of the device through the second multilayer reflecting layer and second cladding layer into the active layer, forming a pn junction in the active layer. A first electrode makes contact with the semiconductor substrate outside the area of the second conductive type. A second electrode makes contact with the surface of the area of the second conductive type.

The invented light-emitting semiconductor device thus has a planar structure and can be manufactured with high yield, without the problems caused by mesa etching.

DETAILED DESCRIPTION OF THE INVENTION

Figure 1:
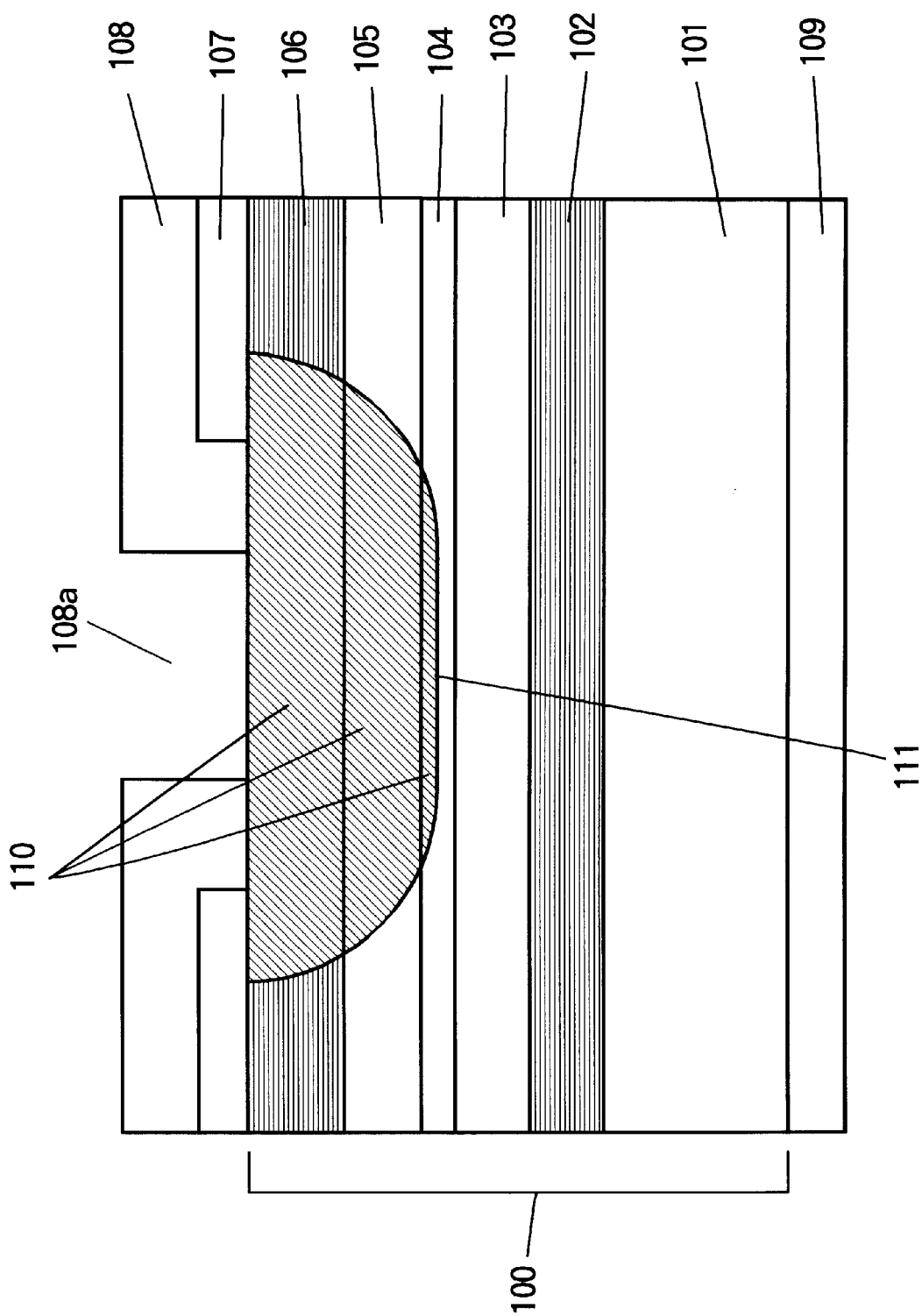
FIG. 1 is a sectional view of a light-emitting semiconductor device illustrating a first embodiment of the invention.

Embodiments of the invention will be described with reference to the attached drawings, in which like parts are identified by like reference characters.

Referring to FIG. 1, the first embodiment is an array of light-emitting elements formed in a common semiconductor substrate 100 comprising, from bottom to top, a substrate layer 101 of a first conductive type, a first multilayer reflecting layer 102, a first cladding layer 103, an active layer 104 of the first conductive type, a second cladding layer 105, and a second multilayer reflecting layer 106. FIG. 1 shows only one light-emitting element in the array. During the fabrication process, the semiconductor substrate 100 has the form of a wafer, in which a large number of arrays can be fabricated at once.

The top surface of the semiconductor substrate 100 is partly covered by an interlayer insulating film 107, which has a circular opening for each light-emitting element in the array. A second-conductive-type electrode 108 makes contact with the surface of the semiconductor substrate 100 through this opening. The second-conductive-type electrode 108 has a circular opening 108a through which light is emitted. A first-conductive-type electrode 109 is formed on the lower surface of the semiconductor substrate 100. An impurity is diffused into the semiconductor substrate 100 to create a diffusion area 110 of the second conductive type below each opening in the interlayer insulating film 107. The depth of the diffusion is controlled so that the diffusion front 111 of the diffusion area 110 terminates in the active layer 104.

The first conductive type and second conductive type are opposite types, one being the negative (n) type and the other being the positive (p) type. A pn junction is formed at the diffusion front 111 in the active layer 104.

The first and second cladding layers 103, 105 both comprise semiconductor materials of the first conductive type. The bandgap energy Eg(103) of the first cladding layer 103, the bandgap energy Eg(104) of the active layer 104, and the bandgap energy Eg(105) of the second cladding layer 105 are related as follows.

Eg(103)>Eg(104)

Eg(105)>Eg(104)

These energy differences create energy barriers that prevent minority carriers injected across the pn junction in the active layer 104 from diffusing into the cladding layers 103, 105.

The first multilayer reflecting layer 102 and second multilayer reflecting layer 106 each comprise alternating layers of two semiconductor materials with different crystal structures, different lattice constants, different refractive indexes, or different bandgap energies (or different composition ratios, if the layers are epitaxial). In the first embodiment, the first multilayer reflecting layer 102 comprises semiconductor materials of the first conductive type; the second multilayer reflecting layer 106 may comprise semiconductor materials of the first conductive type, semi-insulating semiconductor materials, or alternating layers of these two types of semiconductor materials. The first multilayer reflecting layer 102 preferably has a higher reflectivity than the second multilayer reflecting layer 106. The minimum bandgap energy Eg(102) of the semiconductor materials used in the first multilayer reflecting layer 102 and the minimum bandgap energy Eg(106) of the semiconductor materials used in the second multilayer reflecting layer 106 are related to the bandgap energy Eg(104) of the active layer 104 as follows.

Eg(102)>Eg(104)

Eg(106)>Eg(104)

The multilayer reflecting layers 102, 106, cladding layers 103, 105, and active layer 104 comprise, for example, aluminum gallium arsenide ($Al_xGa_{1-x}As$) with differing aluminum composition ratios x (x $\geq$ 0). Alternatively, they comprise indium aluminum gallium arsenide $In_y(Al_xGa_{1-x})_{1-y}As$ with differing aluminum composition ratios x and indium composition ratios y (y $\geq$ 0). Changing the aluminum composition ratio x of $Al_xGa_{1-x}As$ or the aluminum and indium composition ratios x and y of $In_y(Al_xGa_{1-x})_{1-y}As$ alters the bandgap energy of the material.

If the second conductive type is the p type, then the impurity diffused into the diffusion area 110 is a p-type impurity such as zinc (Zn). If the second conductive type is the n type, then the impurity diffused into the diffusion area 110 is an n-type impurity such as tin (Sn) or silicon (Si). These impurities can be diffused by solid-phase diffusion or vapor-phase diffusion. As a result of the diffusion, the second multilayer reflecting layer 106 comprises both regions of the second conductive type and regions of another type (the first conductive type, or a semi-insulating type). The second cladding layer 105 and the active layer 104 each comprise both regions of the second conductive type and regions of the first conductive type. A pn junction is therefore formed in the second cladding layer 105, and in any parts of the second multilayer reflecting layer 106 comprising semiconductor materials of the first conductive type, as well as in the active layer 104.

The interlayer insulating film 107 is formed by depositing and patterning a layer of silicon nitride (SiN), for example, after the diffusion area 110 has been formed. The interlayer insulating film 107 insulates the second-conductive-type electrode 108 from any first-conductive-type part of the second multilayer reflecting layer 106, thereby preventing a short circuit between the second-conductive-type electrode 108 and the first-conductive-type parts of the semiconductor substrate 100.

Figure 2:
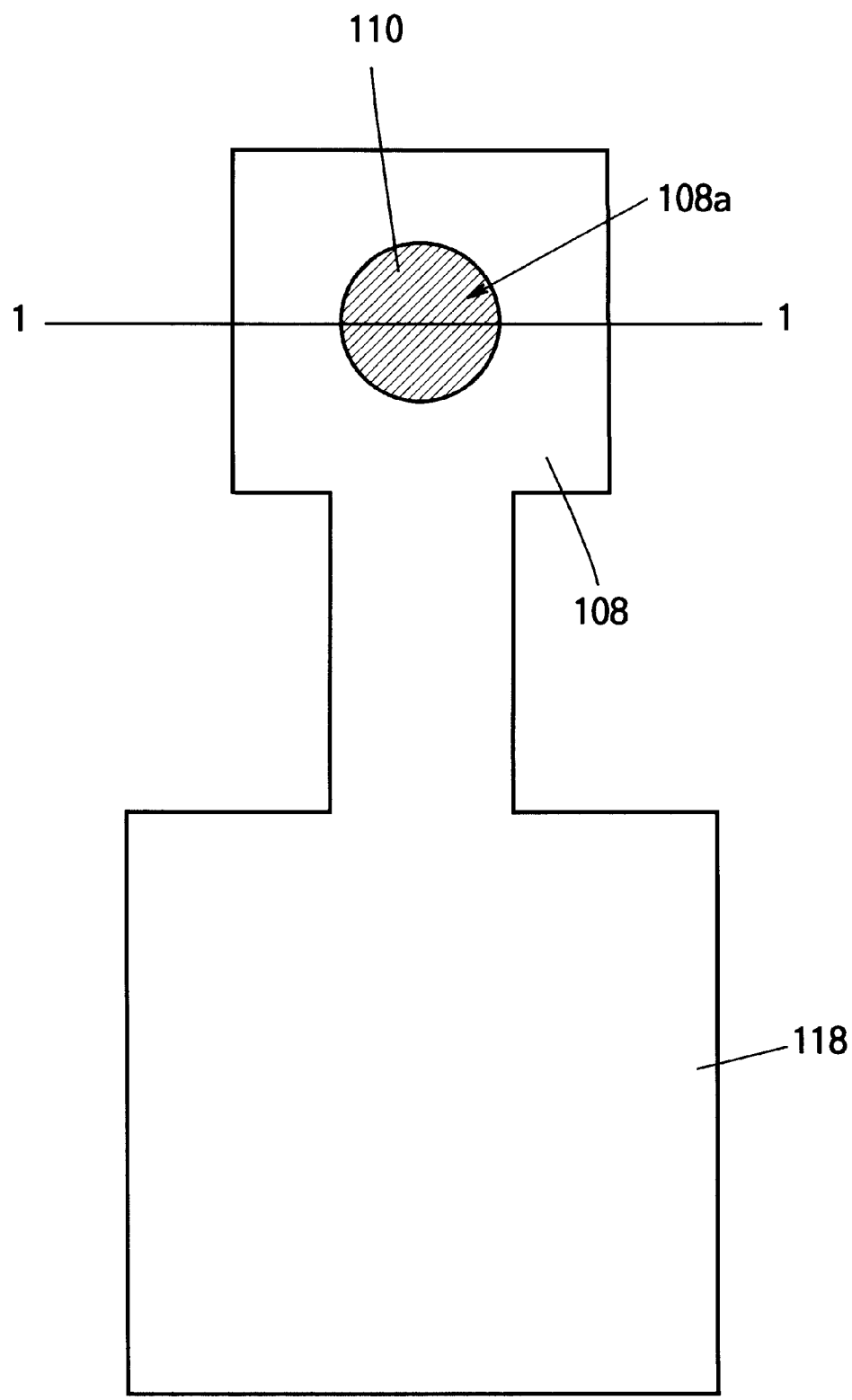
FIG. 2 is a plan view of the first embodiment.
Figure 3:
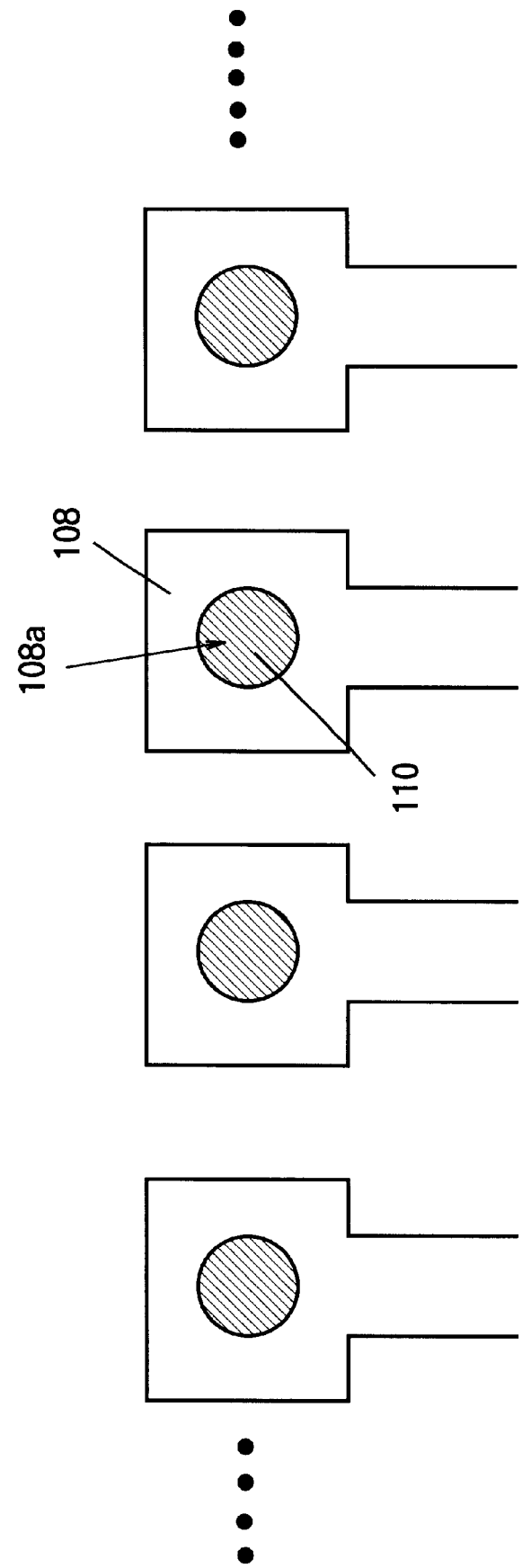
FIG. 3 is another plan view of the first embodiment.

The second-conductive-type electrode 108 and first-conductive-type electrode 109 comprise metal materials such as, for example, aluminum in the p-type electrode and a gold alloy in the n-type electrode. The second-conductive-type electrode 108 and first-conductive-type electrode 109 both reflect light. FIG. 2 shows a top plan view of one light-emitting element, FIG. 1 being a sectional view through line 1—1 in FIG. 2. Light is emitted from the diffusion area 110 through the circular opening 108*a* in the second-conductive-type electrode 108. The second-conductive-type electrode 108 also includes a wire bonding pad 118. FIG. 3 shows a wider plan view, illustrating the arrangement of light-emitting elements in a linear array. Each light-emitting element has a separate second-conductive-type electrode 108, but, referring again to FIG. 1, several or all of the light-emitting elements share the same first-conductive-type electrode 109. The first-conductive-type parts of the semiconductor substrate 100 are also shared by all of the light-emitting elements.

A light-emitting element in the array operates when a forward voltage is applied between the two electrodes 108, 109. Forward current flows through the diffusion area 110, injecting minority carriers across the pn junction. Most of the minority-carrier injection takes place in the active layer 104, since it has a lower bandgap energy than the second cladding layer 105 and second multilayer reflecting layer 106. The injected minority carriers are confined to the active layer 104 by the first cladding layer 103 and second cladding layer 105, as noted above, and recombine with majority carriers in the active layer 104, emitting photons of light in the process. The wavelength of the emitted light is determined by the bandgap energy of the active layer 104.

Much of the light emitted in the active layer 104 is reflected back and forth between the first multilayer reflecting layer 102 and second multilayer reflecting layer 106, stimulating the further emission of light in the active layer 104. If the forward current exceeds a certain threshold value, a net amplification occurs due to the stimulated emission; that is, the light is amplified by laser action. A certain proportion of the light is not reflected by the second multilayer reflecting layer 106, and escapes through the circular opening 108*a*. Since the wavelength of the emitted light corresponds to the bandgap energy of the active layer 104, and since the multilayer reflecting layers 102, 106 and cladding layers 103, 105 have higher bandgap energies, none of the emitted light is absorbed in these layers 102, 103, 105, 106.

Like the conventional device described earlier, the first embodiment provides the advantages of high electro-optic conversion efficiency and the emission of a circular beam perpendicular to the surface of the device. Unlike the conventional device, the first embodiment provides these advantages in a planar device with a flat surface, without the need for mesa etching. The separate light-emitting elements in the array shown in FIG. 3 can therefore be closely spaced, an important advantage in many applications. Furthermore, the flat surface of the device does not impede photolithography, and thereby improves fabrication yields, which is an important advantage in all applications.

In a variation of the first embodiment, one or both of the multilayer reflecting layers 102, 106 have alternating layers of two semiconductor materials, only one of which has a bandgap energy exceeding the bandgap energy Eg(104) of the active layer 104. In this variation, the layers in the multilayer reflecting layers 102, 106 having bandgap energies equal to or less than Eg(104) absorb part of the emitted light, so it is desirable that the aggregate thickness of these layers be small. In addition, any layers in the second multilayer reflecting layer 106 having a bandgap energy equal to or less than Eg(104) should be semi-insulating layers, or should be separated from the second cladding layer 105 by a semi-insulating layer having a bandgap energy exceeding Eg(104), so that minority carriers are not injected across a pn junction in the second multilayer reflecting layer 106. If separated from the second cladding layer 105 by a semi-insulating layer having a bandgap energy exceeding Eg(104), the layers in the second multilayer reflecting layer 106 having a bandgap energy equal to or less than Eg(104) may be layers of the first conductive type.

Next, a second embodiment will be described. The second embodiment emits light from the lower surface of the substrate. The drawings will show only a single light-emitting element, but the second embodiment may also be configured as an array.

Figure 4:
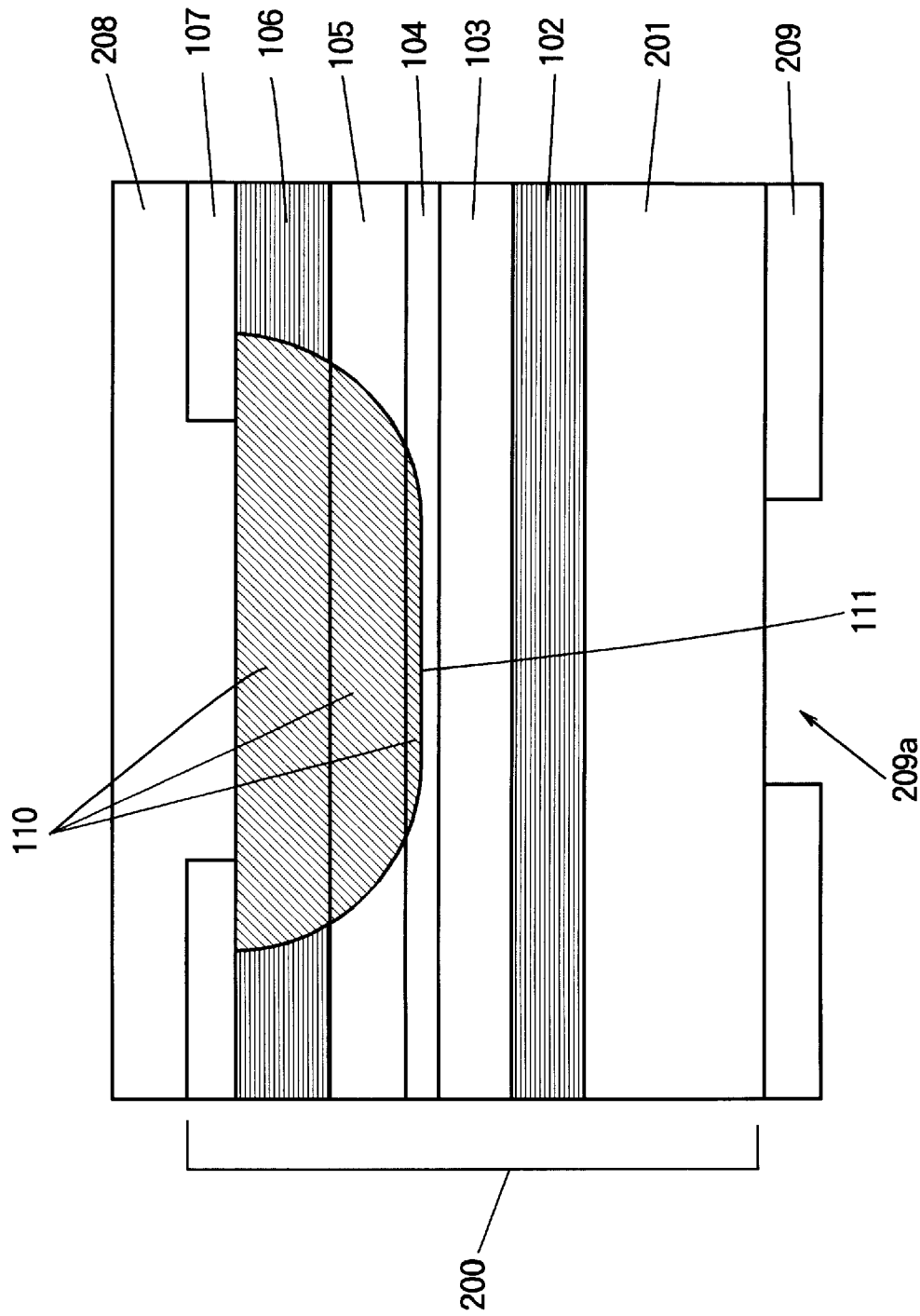
FIG. 4 is a sectional view of a light-emitting semiconductor device illustrating a second embodiment.

Referring to FIG. 4, the semiconductor substrate 200 in the second embodiment comprises a substrate layer 201 of the first conductive type, and the layers 102–106 described in the first embodiment. The substrate layer 201 has a bandgap energy Eg(201) exceeding the bandgap energy Eg(104) of the active layer 104.

$$Eg(201) > Eg(104)$$

The first multilayer reflecting layer 102 preferably has a lower reflectivity than the second multilayer reflecting layer 106.

An interlayer insulating film 107 and second-conductive-type diffusion area 110 are formed as in the first embodiment. The second-conductive-type electrode 208 now makes contact with the entire surface of the diffusion area 110 that is exposed within the opening in the interlayer insulating film 107. On the lower side of the device, a first-conductive-type electrode 209 makes contact with the first-conductive-type substrate layer 201, but the first-conductive-type electrode 209 has a circular opening 209a centered below the diffusion area 110.

Figure 5:
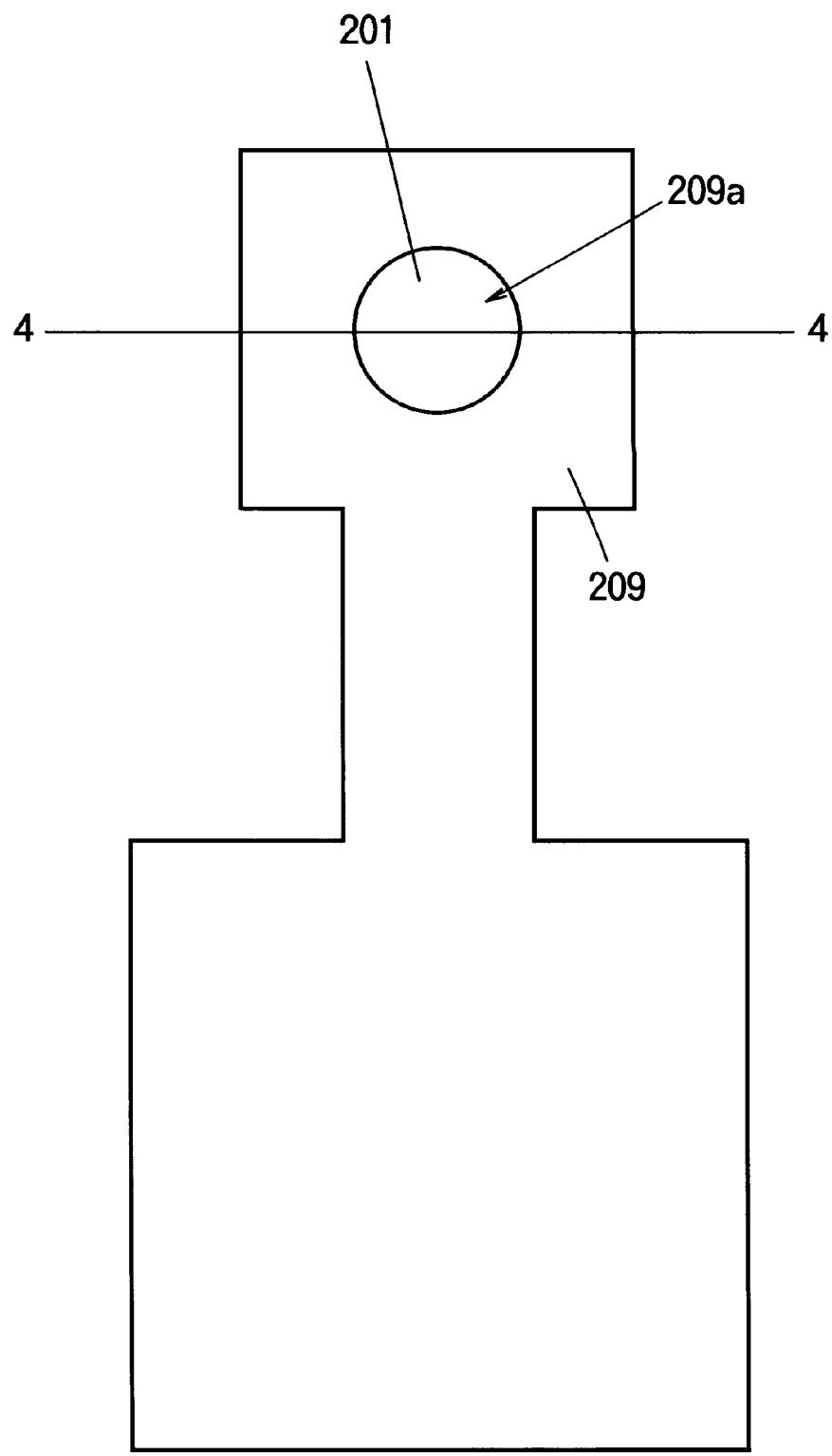
FIG. 5 is a plan view of the second embodiment.

FIG. 5 shows a plan view of the second embodiment. FIG. 4 is a section through line 4—4 in FIG. 5. When the second embodiment is configured as an array, each light-emitting element in the array has an individual second-conductive-type electrode 208, and several or all of the light-emitting elements share the same first-conductive-type electrode 209, as in the first embodiment.

The second embodiment operates in the same way as the first embodiment, except that light is emitted through the circular opening 209a in the first-conductive-type electrode 209. Since the light has a wavelength corresponding to the bandgap energy of the active layer 104, and since all other layers of the semiconductor substrate 200, including the substrate layer 201, have higher bandgap energies, none of the emitted light is absorbed in these other layers.

The second embodiment enables the size of the opening in the interlayer insulating film 107 to be reduced, since this opening only needs to provide a sufficient electrical contact area between the second-conductive-type electrode 208 and diffusion area 110; it does not need to provide a light-emitting area. The dimensions of the diffusion area 110 and the overall dimensions of the light-emitting element can therefore be reduced, even while the area of contact between the second-conductive-type electrode 208 and diffusion area 110 is increased. In an array device, the light-emitting elements can be laid out at a higher density.

Next, a third embodiment will be described. The third embodiment is similar to the first embodiment, but places both the positive and negative electrodes on the same surface. The third embodiment may be configured as either a single light-emitting element or an array.

Figure 6:
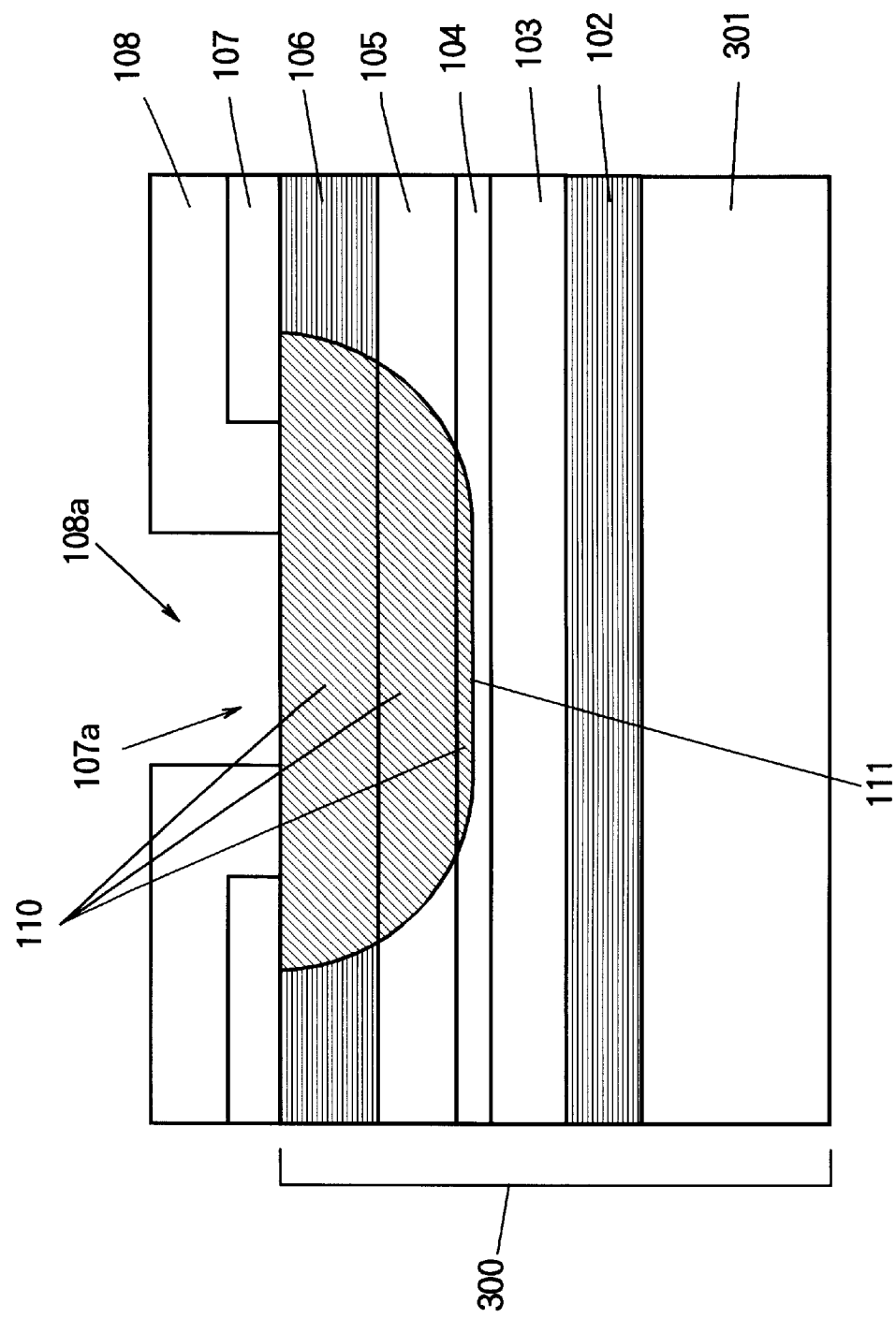
FIG. 6 is a sectional view of a light-emitting semiconductor device illustrating a third embodiment.

FIG. 6 shows a sectional view of one light-emitting element in the third embodiment. The semiconductor substrate 300 comprises a semi-insulating substrate layer 301 and other layers 102–106. These other layers 102–106 are generally as described in the first embodiment, except that all constituent layers of the second multilayer reflecting layer 106 comprise semiconductor materials of the first conductive type. The active layer 104 and cladding layers 103, 105 are also of the first conductive type. The first multilayer reflecting layer 102 comprises semiconductor materials of the first conductive type, or semi-insulating semiconductor materials, or alternating layers of first-conductive-type and semi-insulating semiconductor materials. The first multilayer reflecting layer 102 preferably has a higher reflectivity than the second multilayer reflecting layer 106. An interlayer insulating film 107, second-conductive-type electrode 108, and second-conductive-type diffusion area 110 are formed as described in the first embodiment.

The semi-insulating substrate layer 301 may comprise an intrinsic semiconductor material, or a substantially non-doped semiconductor material with a very low p-type or n-type impurity concentration, providing an electrical resistivity of at least $10^7$ Ω.cm. No electrode is formed in contact with the semi-insulating substrate layer 301.

The substrate layer 301 may also comprise a second-conductive-type semiconductor material.

Figure 7:
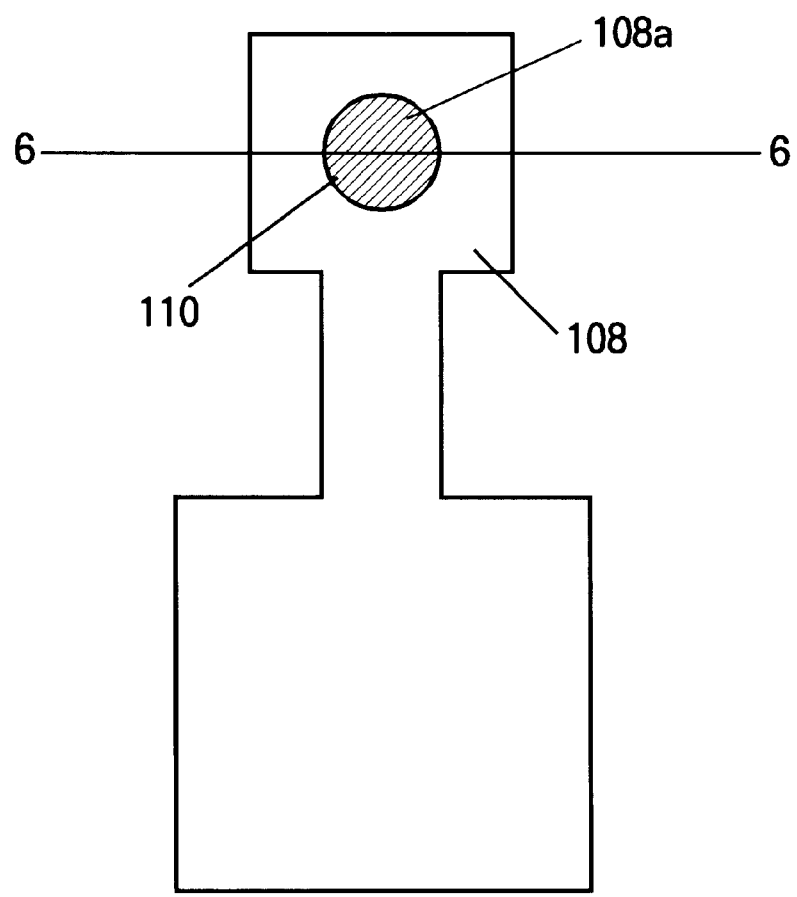
FIG. 7 is a plan view of the third embodiment.
Figure 8:
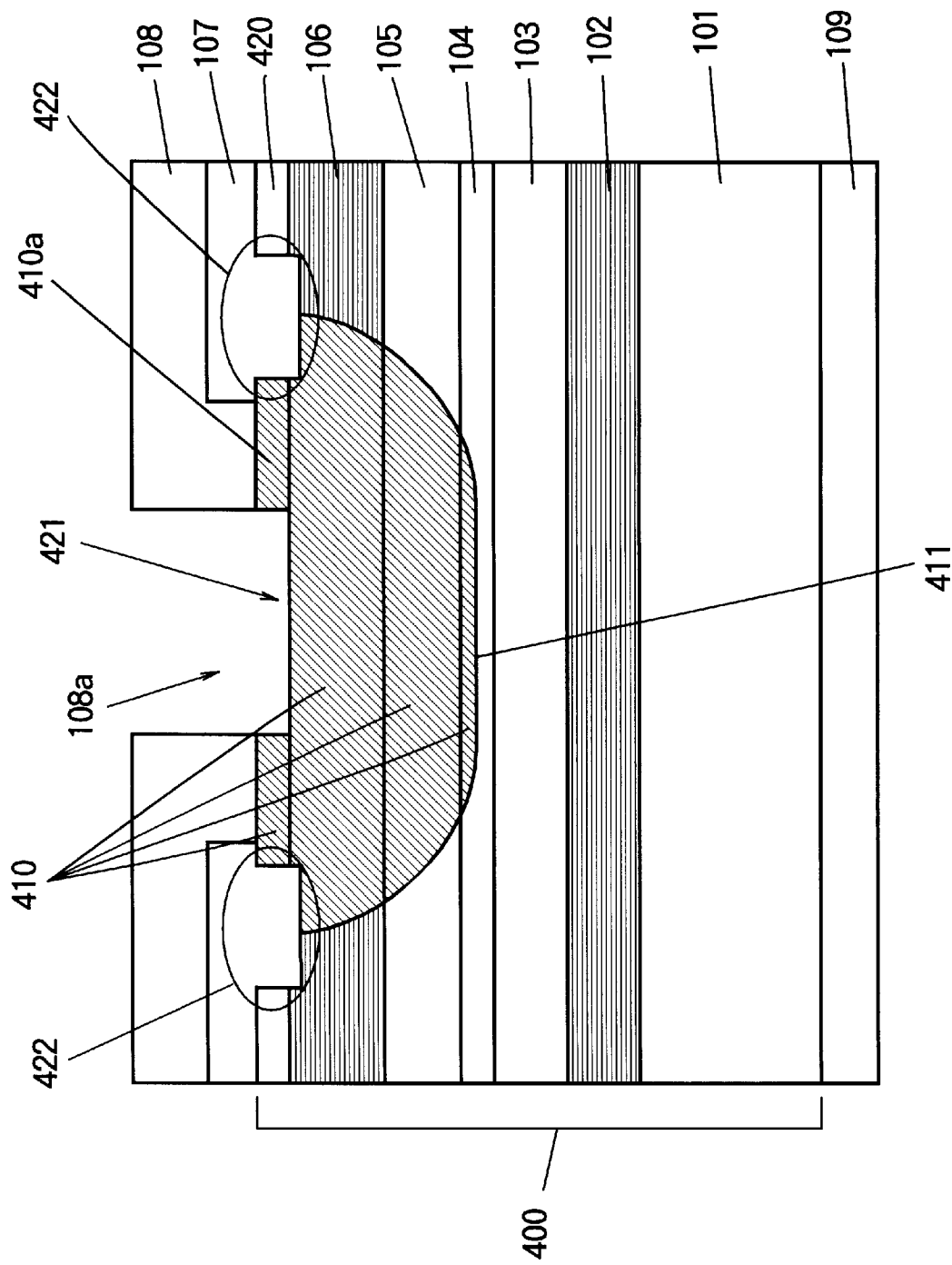
FIG. 8 is a sectional view of a light-emitting semiconductor device illustrating a fourth embodiment.

Referring to FIG. 7, a first-conductive-type electrode 309 is deposited on the upper surface of the device, over an opening 107b in the interlayer insulating film 107. When the third embodiment is configured as a single light-emitting element, the first-conductive-type electrode 309 is preferably disposed near the second-conductive-type electrode 108, as shown. FIG. 6 is a section through line 6—6 in FIG. 7.

The third embodiment operates as described in the first embodiment, the current path between the second-conductive-type electrode 108 and the first-conductive-type electrode 309 including the second-conductive-type diffusion area 110 and the first-conductive-type layers of the semiconductor substrate 300.

When the third embodiment is configured as an array, a matrix driving scheme can be employed, in which the semiconductor substrate 300 is divided into M electrically isolated blocks, each having one first-conductive-type electrode 309 and N light-emitting elements, M and N being positive integers. The M×N second-conductive-type electrodes 108 are linked, via shared interconnecting lines, to just M different wire bonding pads. Each first-conductive-type electrode 309 also functions as a wire bonding pad, so the array of M×N light-emitting elements can be driven with just M+N wire bonding pads. The size of the array can thus be reduced, and the number of bonding wires can be reduced.

In a variation of the third embodiment, the substrate layer 301 is of the second conductive type. Matrix driving is still possible, but it is desirable for the first multilayer reflecting layer 102 to include a semi-insulating constituent layer.

Next, a fourth embodiment will be described.

The semiconductor substrate 400 in the fourth embodiment includes the layers 101–106 described in the first embodiment, and an additional semiconductor cap layer 420. The semiconductor cap layer 420 is, for example, a GaAs layer with a thickness of from five hundred to one thousand angstroms (500 to 1000 Å). This layer may be either a semi-insulating layer, or a layer of the first conductive type. The purpose of the semiconductor cap layer 420 is to assure ohmic contact with the second-conductive-type electrode 108, by providing a layer that is free of materials such as aluminum that might become oxidized. The bandgap energy of the semiconductor cap layer 420 need not be greater than the bandgap energy Eg(104) of the active layer 104; if the bandgap energy of the semiconductor cap layer 420 is not greater than Eg(104), the semiconductor cap layer 420 absorbs light emitted in the active layer 104.

A second-conductive-type diffusion area 410 with a diffusion front 411 terminating in the active layer 104 is formed as in the first embodiment, the diffusion area 410 now including part of the semiconductor cap layer 420. As a result of the diffusion, the semiconductor cap layer 420 includes a region of second-conductive-type cap material 410a. If the semiconductor cap layer 420 is of the first conductive type, the semiconductor cap layer 420 includes a pn junction at the diffusion front 411.

After the diffusion area 410 has been formed, the upper surface of the device is selectively etched to remove the second-conductive-type cap material 410a from the area from which light will be emitted, so that the second-conductive-type cap material 410a does not absorb any of the light emitted through this area. This etching step creates a central etched area 421 in each diffusion area 410.

In addition, a peripheral etched area 422 is created at the perimeter of the diffusion area 410, all of the material of the semiconductor cap layer 420 containing the diffusion front 411 thereby being removed. Material of the second multilayer reflecting layer 106 disposed at the interface with the semiconductor cap layer 420 is also removed in this peripheral etched area 422. This etched area 422 creates a physical gap between the second-conductive-type cap material 410a and the regions of the semiconductor cap layer 420 and second multilayer reflecting layer 106 that are not of the second conductive type.

After formation of the central etched area 421 and peripheral etched area 422, an interlayer insulating film 107 and second-conductive-type electrode 108 are formed as in the first embodiment, the interlayer insulating film 107 filling in the peripheral etched area 422. The circular opening 108a in the second-conductive-type electrode 108 is aligned with the central etched area 421, so that the second-conductive-type electrode 108 contacts the second-conductive-type cap material 410a instead of contacting the second multilayer reflecting layer 106. A first-conductive-type electrode 109 is also formed on the underside of the device.

The fourth embodiment operates substantially as described in the first embodiment, the second-conductive-type cap material 410a assuring an ohmic contact between the second-conductive-type electrode 108 and the diffusion area 410. The peripheral etched area 422 prevents lateral leakage of current from the second-conductive-type cap material 410a, forcing all current to flow through the second-conductive-type part of the second multilayer reflective layer 106. The bandgap energy relations of this layer 106 and the second cladding layer 105 and active layer 104 are the same as in the first embodiment, assuring that substantially all of the current is channeled across the pn junction at the diffusion front 411 in the active layer 104. If the current exceeds the threshold value, laser action generates a beam of light that is emitted through the circular opening 108a. Since this opening 108a coincides with the central etched area 421, no light is lost to absorption by the semiconductor cap layer 420.

The peripheral etched area 422 also has the effect of preventing lateral leakage of current from the second multilayer reflecting layer 106. The diffusion front 411 tends to be sharply irregular near the surface of the device. If the part of the diffusion front 411 near the surface is not removed by etching, and if the second multilayer reflecting layer 106 comprises semiconductor materials of the first conductive type, strong electric fields generated at the irregular diffusion front would inject minority carriers laterally across the pn junction in the second multilayer reflecting layer 106. Recombination of these minority carriers with majority carriers in the second multilayer reflecting layer 106 would not contribute to the laser action. Much of the recombination would not even generate light, due to the presence of crystal defects acting as nonradiative recombination centers near the surface of the device.

Compared with the first embodiment, the fourth embodiment reduces the electrical resistance between the second-conductive-type electrode 108 and the semiconductor cap layer 410a, and prevents unwanted lateral current leakage, so the fourth embodiment generates light even more efficiently than the first embodiment.

If the semiconductor cap layer 420 has a bandgap energy exceeding Eg(104) and hence does not absorb the emitted light, the central etched area 421 is not necessary; the second-conductive-type cap material 410a can be left in place below the opening 108a in the second-conductive-type electrode 108.

Even if the semiconductor cap layer 420 has a bandgap energy less than Eg(104), the central etched area 421 can be omitted, provided the semiconductor cap layer 420 is thin enough (for example, 500 Å or less) so as not to cause significant absorption of light.

The peripheral etched area 422 is shown extending partly into the second multilayer reflecting layer 106, but this not a requirement; the etch can be halted at the interface between the semiconductor cap layer 420 and the second multilayer reflecting layer 106, so that none of the material of the second multilayer reflecting layer 106 is removed, provided that any resulting lateral current leakage is small enough to be tolerated. If the semiconductor cap layer 420 comprises a semi-insulating semiconductor material, the peripheral etched area 422 can be dispensed with entirely, provided again that any resulting lateral current leakage is sufficiently small.

If the second multilayer reflecting layer 106 is made of materials that assure ohmic contact with the second-conductive-type electrode 108, the semiconductor cap layer 420 can be omitted. In this case, the central etched area 421 is also omitted, but it is still desirable to provide a peripheral etched area 422 with a depth of from five hundred to two thousand angstroms (500 to 2000 Å), for example, to remove the irregular parts of the diffusion front 411 near the surface of the device.

Next, a fifth embodiment will be described. The fifth embodiment combines the features of the second and fourth embodiments. The fifth embodiment will be described as a single light-emitting element, but can also be configured as an array.

Figure 9:
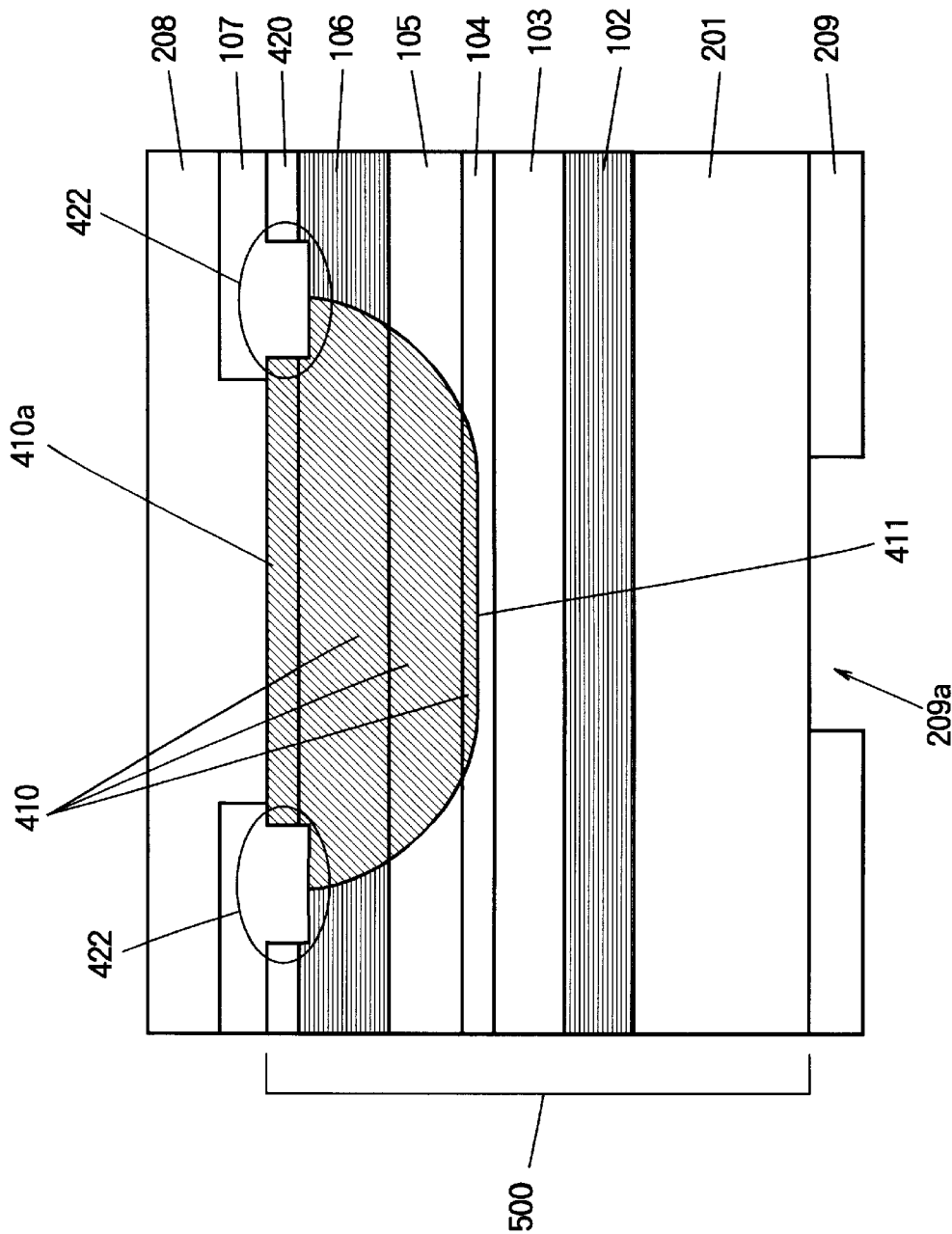
FIG. 9 is a sectional view of a light-emitting semiconductor device illustrating a fifth embodiment.

Referring to FIG. 9, the semiconductor substrate 500 of the fifth embodiment adds a semiconductor cap layer 420, as in the fourth embodiment, to the semiconductor substrate described in the second embodiment. A second-conductive-type diffusion area 410 and peripheral etched area 422 are formed as in the fourth embodiment, but no central etched area is formed. The interlayer insulating film 107, second-conductive-type electrode 208, and first-conductive-type electrode 209 are as described in the second embodiment, the second-conductive-type electrode 208 making contact with the second-conductive-type cap material 410a over substantially the entire surface of the diffusion area 410, except for the part disposed in the peripheral etched area 422 and a small additional part covered by the interlayer insulating film 107.

In plan view, the fifth embodiment has the same configuration as the second embodiment, shown in FIG. 5. FIG. 9 is a section through line 4—4 in FIG. 5.

The fifth embodiment operates as described in the second embodiment, a beam of light being emitted through the circular opening 209a in the first-conductive-type electrode 209. As in the fourth embodiment, the semiconductor cap layer 420 assures an ohmic contact between the second-conductive-type electrode 208 and the diffusion area 410, and the peripheral etched area 422 prevents lateral current leakage, enhancing the efficiency of the device.

The fifth embodiment provides the same advantages of small device size and close array spacing as the second embodiment, with enhanced light-emitting efficiency resulting from the semiconductor cap layer 420 and peripheral etched area 422.

In a variation of the fifth embodiment, the second multilayer reflecting layer 106 comprises materials capable of assuring an ohmic contact with the second-conductive-type electrode 208, and the semiconductor cap layer 420 is omitted. The peripheral etched area then extends a certain distance into the second multilayer reflecting layer 106, to remove the irregular surface portions of the diffusion front 411.

Next, a sixth embodiment will be described. The sixth embodiment combines the features of the third and fourth embodiments, and can be configured as a single light-emitting element or as an array.

Figure 10:
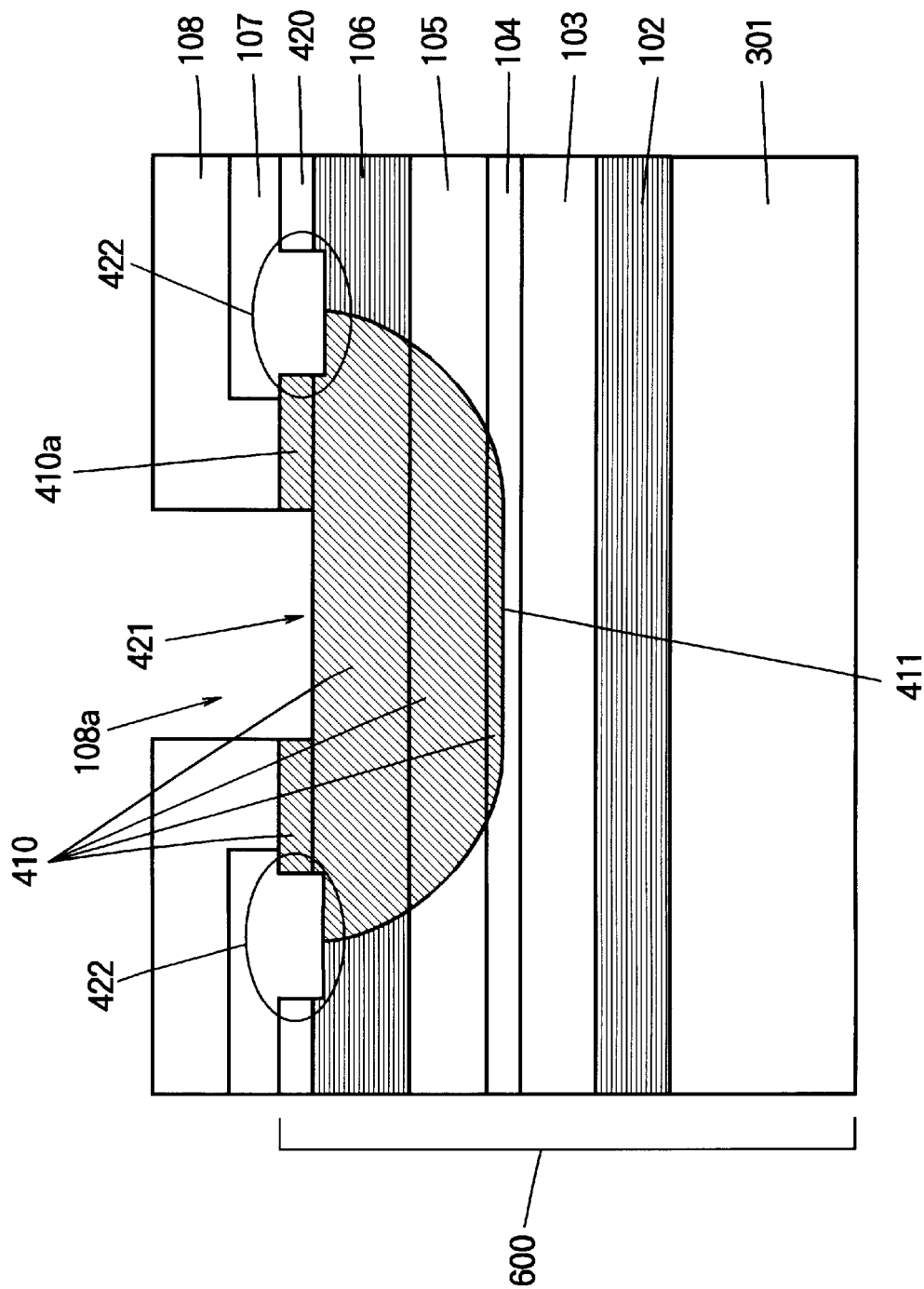
FIG. 10 is a sectional view of a light-emitting semiconductor device illustrating a sixth embodiment.
Figure 11:
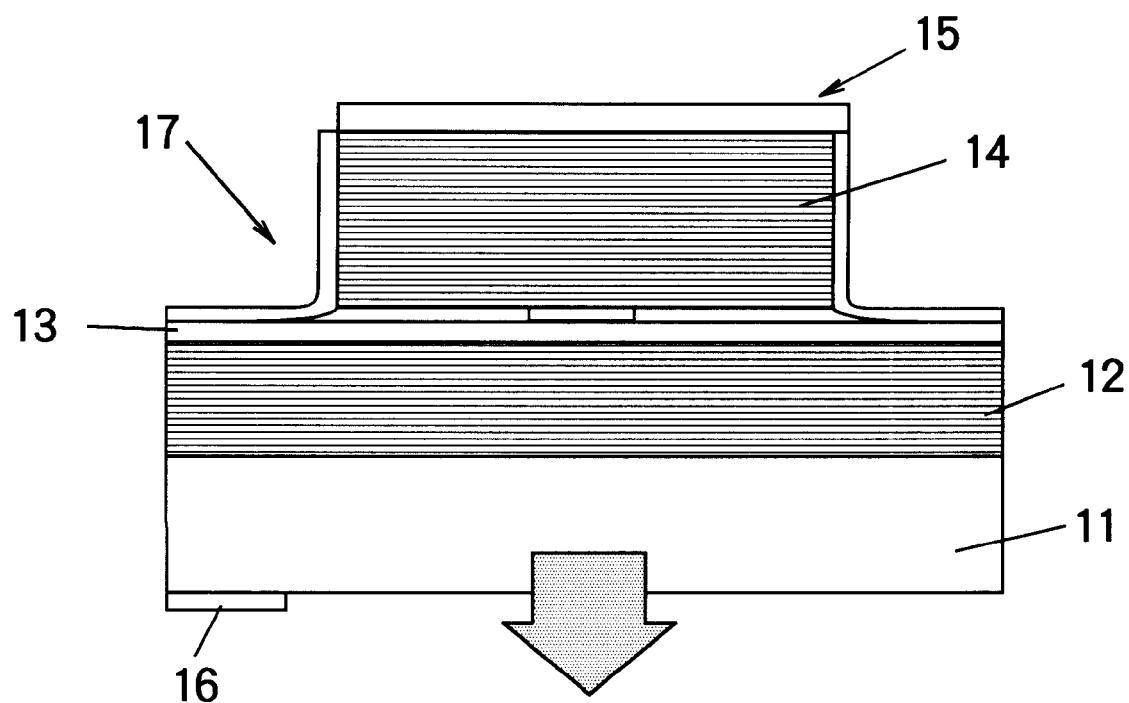
FIG. 11 is a sectional view of a conventional light-emitting semiconductor device.

Referring to FIG. 10, the semiconductor substrate 600 of the sixth embodiment adds a semiconductor cap layer 420, as in the fourth embodiment, to the semiconductor substrate described in the third embodiment. A second-conductive-type diffusion area 410, central etched area 421, and peripheral etched area 422 are formed as in the fourth embodiment. The interlayer insulating film 107 and second-conductive-type electrode 108 are as described in the third embodiment, the second-conductive-type electrode 108 making contact with the second-conductive-type cap material 410a as in the fourth embodiment.

In plan view, the sixth embodiment has the same configuration as the third embodiment, with a first-conductive-type electrode 309 on the upper surface, as shown in FIG. 7. FIG. 10 is a section through line 6—6 in FIG. 7.

The sixth embodiment operates as described in the third embodiment, emitting light through the circular opening 108a in the second-conductive-type electrode 108. As in the fourth embodiment, the semiconductor cap layer 420 assures an ohmic contact between the second-conductive-type electrode 108 and the diffusion area 410, and the peripheral etched area 422 prevents lateral current leakage, enhancing the efficiency of the device.

The sixth embodiment provides the matrix driving capability described in the third embodiment, with enhanced light-emitting efficiency resulting from the semiconductor cap layer 420, central etched area 421, and peripheral etched area 422.

In a variation of the sixth embodiment, the second multilayer reflecting layer 106 comprises materials capable of assuring an ohmic contact with the second-conductive-type electrode 208, and the semiconductor cap layer 420 and central etched area 421 are omitted. The peripheral etched area then extends a certain distance into the second multilayer reflecting layer 106, to remove the irregular surface portions of the diffusion front 411.

As described above, the present invention provides a planar device capable of emitting a beam of light from its upper surface, or from its lower surface, without requiring mesa etching of either surface. It is anticipated that this basic feature can significantly improve production yields. The invention also provides cladding layers that confine injected carriers to the active layer, a semiconductor cap layer that assures ohmic electrical contact, and etched areas that prevent lateral current leakage and light absorption, these features enhancing the efficiency of light emission.

A few variations of the above embodiments have already been mentioned, but those skilled in the art will recognize that further modifications are possible within the scope claimed below.

What is claimed is:

1. A light-emitting semiconductor device, comprising:
   a semiconductor substrate with an upper surface and a lower surface, having at least, in lower-to-upper order, a first multilayer reflecting layer, a first cladding layer, an active layer of a first conductive type, a second cladding layer, and a second multilayer reflecting layer, the first multilayer reflecting layer and the second multilayer reflecting layer respectively comprising alternating layers of different semiconductor materials, the active layer having a bandgap energy, the first cladding layer and the second cladding layer having respective bandgap energies exceeding the bandgap energy of the active layer, the first multilayer reflecting layer and the second multilayer reflecting layer each including at least one constituent layer with a bandgap energy exceeding the bandgap energy of the active layer;
   an area of a second conductive type extending from said upper surface into said active layer in at least one selected region of said semiconductor substrate, forming a pn junction in said active layer;
   a first electrode making contact with said semiconductor substrate outside said area of said second conductive type; and
   a second electrode making contact with said upper surface in said area of said second conductive type.

2. The light-emitting semiconductor device of claim 1, wherein all constituent layers of said first multilayer reflecting layer and said second multilayer reflecting layer have bandgap energies exceeding the bandgap energy of said active layer.

3. The light-emitting semiconductor device of claim 1, wherein all constituent layers of said first multilayer reflecting layer and said second multilayer reflecting layer are semiconductor layers selected from among said first conductive type and a semi-insulating type.

4. The light-emitting semiconductor device of claim 3, wherein said semiconductor substrate comprises a substrate layer of said first conductive type disposed at said lower surface, all constituent layers of said first multilayer reflecting layer are semiconductor layers of said first conductive type, and said first electrode is disposed on said lower surface.

5. The light-emitting semiconductor device of claim 4, wherein said substrate layer has a bandgap energy exceeding the bandgap energy of said active layer, and said first electrode has an opening, disposed below said pn junction, through which light is emitted.

6. The light-emitting semiconductor device of claim 4, wherein said second electrode has an opening, disposed above said area of said second conductive type, through which light is emitted.

7. The light-emitting semiconductor device of claim 3, wherein said second cladding layer is of said first conductive type, all constituent layers of said second multilayer reflecting layer are of said first conductive type, and said first electrode is disposed on said upper surface.

8. The light-emitting semiconductor device of claim 7, wherein said semiconductor substrate comprises a semi-insulating substrate layer disposed at said lower surface.

9. The light-emitting semiconductor device of claim 8, wherein said first multilayer reflecting layer includes a semi-insulating layer.

10. The light-emitting semiconductor device of claim 7, wherein said semiconductor substrate comprises a substrate layer of said second conductive type disposed at said lower surface.

11. The light-emitting semiconductor device of claim 10, wherein said first multilayer reflecting layer includes a semi-insulating layer.

12. The light-emitting semiconductor device of claim 7, wherein said second electrode has an opening, disposed above said area of said second conductive type, through which light is emitted.

13. The light-emitting semiconductor device of claim 1, wherein said area of said second conductive type is formed by selective diffusion of an impurity of said second conductive type from said upper surface.

14. The light-emitting semiconductor device of claim 13, wherein said area of said second conductive type has a diffusion front, and said upper surface has an etched area in which said diffusion front is removed by etching.

15. The light-emitting semiconductor device of claim 13, wherein said impurity is zinc.

16. The light-emitting semiconductor device of claim 13, wherein said impurity is selected from among tin and silicon.

17. The light-emitting semiconductor device of claim 1, wherein said semiconductor substrate comprises a semiconductor cap layer disposed at said upper surface, and said second electrode makes ohmic contact with a part of said semiconductor cap layer disposed within said area of said second conductive type.

18. The light-emitting semiconductor device of claim 17, wherein said area of said second conductive type is formed by selective diffusion of an impurity of said second conductive type from said upper surface.

19. The light-emitting semiconductor device of claim 18, wherein said area of said second conductive type has a diffusion front, and said semiconductor cap layer has an etched area in which said diffusion front is removed by etching.

20. The light-emitting semiconductor device of claim 19, wherein said semiconductor cap layer has a lower interface, and said diffusion front is also removed by etching from said lower interface.

21. The light-emitting semiconductor device of claim 17, wherein said impurity is zinc.

22. The light-emitting semiconductor device of claim 17, wherein said impurity is selected from among tin and silicon.

* * * * *